US010678443B2

(12) United States Patent
Li et al.

(10) Patent No.: US 10,678,443 B2
(45) Date of Patent: Jun. 9, 2020

(54) METHOD AND SYSTEM FOR HIGH-DENSITY CONVERGED STORAGE VIA MEMORY BUS

(71) Applicant: Alibaba Group Holding Limited, George Town, Grand Cayman (KY)

(72) Inventors: Shu Li, Bothell, WA (US); Jianjian Huo, San Jose, CA (US)

(73) Assignee: Alibaba Group Holding Limited, George Town (KY)

( * ) Notice: Subject to any disclaimer, the term of this patent is extended or adjusted under 35 U.S.C. 154(b) by 20 days.

(21) Appl. No.: 15/643,140

(22) Filed: Jul. 6, 2017

(65) Prior Publication Data

US 2019/0012094 A1    Jan. 10, 2019

(51) Int. Cl.
| | |
|---|---|
| G06F 3/06 | (2006.01) |
| G06F 13/40 | (2006.01) |
| G06F 12/08 | (2016.01) |
| G06F 12/10 | (2016.01) |
| G06F 12/0804 | (2016.01) |
| G06F 11/10 | (2006.01) |
| G06F 12/02 | (2006.01) |
| H03M 13/29 | (2006.01) |
| H03M 13/09 | (2006.01) |

(52) U.S. Cl.
CPC .......... *G06F 3/0611* (2013.01); *G06F 3/0619* (2013.01); *G06F 3/0647* (2013.01); *G06F 3/0656* (2013.01); *G06F 3/0658* (2013.01); *G06F 3/0685* (2013.01); *G06F 11/1012* (2013.01); *G06F 11/1076* (2013.01); *G06F 12/0246* (2013.01); *G06F 12/0804* (2013.01); *G06F 12/10* (2013.01); *G06F 2212/1024* (2013.01); *G06F 2212/205* (2013.01); *G06F 2212/281* (2013.01); *G06F 2212/401* (2013.01); *G06F 2212/7201* (2013.01); *H03M 13/09* (2013.01); *H03M 13/2906* (2013.01)

(58) Field of Classification Search
CPC ............. G06F 3/06; G06F 13/40; G06F 12/08
See application file for complete search history.

(56) References Cited

U.S. PATENT DOCUMENTS

| | | |
|---|---|---|
| 4,775,932 A | 10/1988 | Oxley |
| 6,226,650 B1 | 5/2001 | Mahajan et al. |

(Continued)

FOREIGN PATENT DOCUMENTS

WO    1994018634    8/1994

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — David E Martinez
(74) *Attorney, Agent, or Firm* — Shun Yao; Park, Vaughan, Fleming & Dowler LLP

(57) ABSTRACT

One embodiment facilitates a high-density converged storage system. During operation, the system receives, by a volatile memory of a storage device via a memory bus, data to be stored in a non-volatile memory of the same storage device. The system writes, by a controller of the storage device, the data directly to the non-volatile memory via the volatile memory, e.g., without using a serial bus protocol.

20 Claims, 12 Drawing Sheets

(56) References Cited

U.S. PATENT DOCUMENTS

| | | |
|---|---|---|
| 7,565,454 B2 | 7/2009 | Zuberi |
| 8,260,924 B2 | 9/2012 | Koretz |
| 8,452,819 B1 | 5/2013 | Sorenson, III |
| 8,516,284 B2 | 8/2013 | Chan |
| 8,751,763 B1 | 6/2014 | Ramarao |
| 8,825,937 B2 | 9/2014 | Atkisson |
| 9,043,545 B2 | 5/2015 | Kimmel |
| 9,088,300 B1 | 7/2015 | Chen |
| 9,092,223 B1 | 7/2015 | Pani |
| 9,280,472 B1 | 3/2016 | Dang |
| 9,280,487 B2 | 3/2016 | Candelaria |
| 9,529,601 B1 | 12/2016 | Dharmadhikari |
| 9,588,698 B1 | 3/2017 | Karamcheti |
| 9,588,977 B1 | 3/2017 | Wang |
| 10,013,169 B2 | 7/2018 | Fisher |
| 2002/0010783 A1 | 1/2002 | Primak |
| 2002/0073358 A1 | 6/2002 | Atkinson |
| 2002/0161890 A1 | 10/2002 | Chen |
| 2003/0163594 A1 | 8/2003 | Aasheim |
| 2003/0163633 A1 | 8/2003 | Aasheim |
| 2004/0010545 A1 | 1/2004 | Pandya |
| 2004/0255171 A1 | 12/2004 | Zimmer |
| 2004/0268278 A1 | 12/2004 | Hoberman |
| 2005/0038954 A1 | 2/2005 | Saliba |
| 2005/0097126 A1 | 5/2005 | Cabrera |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0156012 A1 | 7/2006 | Beeson |
| 2007/0033323 A1 | 2/2007 | Gorobets |
| 2007/0101096 A1 | 5/2007 | Gorobets |
| 2008/0034154 A1 | 2/2008 | Lee |
| 2009/0113219 A1 | 4/2009 | Aharonov |
| 2009/0282275 A1 | 11/2009 | Yermalayeu |
| 2009/0307249 A1 | 12/2009 | Koifman |
| 2009/0310412 A1 | 12/2009 | Jang |
| 2010/0169470 A1 | 7/2010 | Takashige |
| 2010/0229224 A1 | 9/2010 | Etchegoyen |
| 2010/0325367 A1 | 12/2010 | Kornegay |
| 2011/0055458 A1 | 3/2011 | Kuehne |
| 2011/0153903 A1 | 6/2011 | Hinkle |
| 2011/0218969 A1 | 9/2011 | Anglin |
| 2011/0231598 A1 | 9/2011 | Hatsuda |
| 2011/0292538 A1 | 12/2011 | Haga |
| 2011/0302353 A1 | 12/2011 | Confalonieri |
| 2012/0084523 A1 | 4/2012 | Littlefield |
| 2012/0117399 A1 | 5/2012 | Chan |
| 2012/0147021 A1 | 6/2012 | Cheng |
| 2012/0159289 A1 | 6/2012 | Piccirillo |
| 2012/0210095 A1 | 8/2012 | Nellans |
| 2012/0246392 A1 | 9/2012 | Cheon |
| 2012/0278579 A1 | 11/2012 | Goss |
| 2012/0284587 A1 | 11/2012 | Yu |
| 2013/0061029 A1 | 3/2013 | Huff |
| 2013/0073798 A1 | 3/2013 | Kang |
| 2013/0145085 A1 | 6/2013 | Yu |
| 2013/0145089 A1* | 6/2013 | Eleftheriou ......... G06F 12/0246 711/103 |
| 2013/0151759 A1 | 6/2013 | Shim |
| 2013/0159251 A1 | 6/2013 | Skrenta |
| 2013/0166820 A1 | 6/2013 | Batwara |
| 2013/0173845 A1 | 7/2013 | Aslam |
| 2013/0219131 A1 | 8/2013 | Alexandron |
| 2013/0318283 A1 | 11/2013 | Small |
| 2014/0108414 A1 | 4/2014 | Stillerman |
| 2014/0181532 A1 | 6/2014 | Camp |
| 2014/0233950 A1 | 8/2014 | Luo |
| 2014/0250259 A1 | 9/2014 | Ke |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1* | 4/2015 | Cho .................. G06F 3/0617 711/103 |
| 2015/0142752 A1 | 5/2015 | Chennamsetty |
| 2015/0227316 A1 | 8/2015 | Warfield |
| 2015/0277937 A1 | 10/2015 | Swanson |
| 2015/0304108 A1 | 10/2015 | Obukhov |
| 2015/0363271 A1 | 12/2015 | Haustein |
| 2015/0372597 A1 | 12/2015 | Luo |
| 2016/0014039 A1 | 1/2016 | Reddy |
| 2016/0098344 A1 | 4/2016 | Gorobets |
| 2016/0110254 A1 | 4/2016 | Cronie |
| 2016/0232103 A1 | 8/2016 | Schmisseur |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0343429 A1 | 11/2016 | Nieuwejaar |
| 2016/0350002 A1 | 12/2016 | Vergis |
| 2017/0075583 A1 | 3/2017 | Alexander |
| 2017/0075594 A1 | 3/2017 | Badam |
| 2017/0109232 A1 | 4/2017 | Cha |
| 2017/0162235 A1 | 6/2017 | De |
| 2017/0168986 A1 | 6/2017 | Sajeepa |
| 2017/0212708 A1 | 7/2017 | Suhas |
| 2017/0228157 A1 | 8/2017 | Yang |
| 2017/0249162 A1 | 8/2017 | Tsirkin |
| 2017/0262178 A1* | 9/2017 | Hashimoto .......... G06F 3/0604 |
| 2017/0285976 A1 | 10/2017 | Durham |
| 2017/0286311 A1 | 10/2017 | Juenemann |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0088867 A1 | 3/2018 | Kaminaga |
| 2018/0143780 A1 | 5/2018 | Cho |
| 2018/0167268 A1 | 6/2018 | Liguori |
| 2018/0189182 A1 | 7/2018 | Wang |
| 2018/0270110 A1 | 9/2018 | Chugtu |
| 2018/0329776 A1 | 11/2018 | Lai |
| 2018/0373428 A1 | 12/2018 | Kan |
| 2019/0012111 A1 | 1/2019 | Li |
| 2019/0073262 A1 | 3/2019 | Chen |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

* cited by examiner

METHOD AND SYSTEM FOR HIGH-DENSITY CONVERGED STORAGE VIA MEMORY BUS

BACKGROUND

Field

This disclosure is generally related to the field of data storage. More specifically, this disclosure is related to a method and system for high-density converged storage via memory bus.

Related Art

The proliferation of the Internet and e-commerce continues to create a vast amount of digital content. Various storage systems have been created to access and store such digital content. In a standard storage system, a server which stores data can be connected to a volatile memory (such as a Dual In-line Memory Module (DIMM) Dynamic Random Access Memory (DRAM)) via a memory bus. An approximate latency via the memory bus for processing an I/O request is typically less than one microsecond (μs).

A server in a standard storage system may also be connected to non-volatile memory (such as peripheral storage devices, solid state drives, and NAND flash memory) via a serial bus protocol. For example, a Peripheral Component Interconnect express (PCIe) device like a solid state drive (SSD) may be connected to a server's central processing unit (CPU) using a PCIe or Non-Volatile Memory express (NVMe) protocol. As another example, a Serial Attachment SCSI (SAS) or a Serial AT Attachment (SATA) SSD may be connected to a server's CPU using an SAS/SATA protocol. The NVMe protocol may require approximately 4 μs or more to process an I/O request (e.g., a round-trip time for a read or a write); the PCIe protocol may require approximately 5 μs or more to process an I/O request; and the SAS/SATA protocol may require approximately 25 μs or more to process an I/O request.

Thus, the current serial bus protocols for accessing storage devices (i.e., non-volatile memory) result in a greater latency than the latency for accessing DRAM (i.e., volatile memory) via a memory bus (4-25 μs vs. 1 μs). This current architecture can result in an inefficient storage system, with a higher than optimal latency. The higher latency associated with the serial bus protocols may also create an upper bound or a cap on optimization of storage-related operations, which can decrease the efficiency of a storage system.

SUMMARY

One embodiment facilitates a high-density converged storage system. During operation, the system receives, by a volatile memory of a storage device via a memory bus, data to be stored in a non-volatile memory of the same storage device. The system writes, by a controller of the storage device, the data directly to the non-volatile memory via the volatile memory, e.g., without using a serial bus protocol.

In some embodiments, the system transmits, by the volatile memory, the data for storage in a buffer of the controller. The system maps, by the volatile memory, a logical block address of the data to a physical block address of the non-volatile memory, wherein writing the data to the non-volatile memory is based on the physical block address.

In some embodiments, the system stores the data in a buffer of the volatile memory, wherein transmitting the data to the controller and writing the data to the non-volatile memory are in response to determining that the data in the buffer of the volatile memory is to be flushed from the volatile memory and written to the non-volatile memory.

In some embodiments, the system processes, by the controller, the data, by: encoding the data based on a cyclic redundancy check; compressing the encoded data; encrypting the compressed data; encoding the encrypted data based on an error correction code (ECC); and adjusting a format of the ECC-encoded data.

In some embodiments, while processing the data, the system stores the data in a buffer of the controller based on a predetermined condition.

In some embodiments, the data is received by the volatile memory via one or more of: a memory channel switch; a switch; and a multiplexing device.

In some embodiments, the high-density converged storage system includes the storage device and one or more other storage devices, and a respective storage device includes a volatile memory, a controller, and a non-volatile memory.

In some embodiments, writing the data to the non-volatile memory is in response to determining, by a power-detecting circuit of the storage device, a loss in power.

Another embodiment facilitates a high-density converged storage system. During operation, the system receives, by a volatile memory of a storage device via a memory bus, a request to read data. The system retrieves, by a controller of the storage device, the data directly from a non-volatile memory of the same storage device, e.g., without using a serial bus protocol. The system returns the retrieved data via the volatile memory.

In some embodiments, the system obtains, by a flash translation layer module of the volatile memory, a mapping of a logical block address of the data to a physical block address of the data in the non-volatile memory. Retrieving the data from the non-volatile memory is based on the physical block address, and the retrieved data is returned to a processor associated with the storage device.

In some embodiments, the system process, by the controller, the retrieved data, by: adjusting a format of the retrieved data; decoding the adjusted data based on an error correction code (ECC); decrypting the ECC-decoded data; decompressing the decrypted data; and decoding the decompressed data based on a cyclic redundancy check.

In some embodiments, while processing the retrieved data, the system stores the data in a first buffer of the controller based on a predetermined condition.

In some embodiments, retrieving the data from the non-volatile memory is in response to determining, by the volatile memory, that the data is not stored in the volatile memory. Furthermore, in response to determining that the data is stored in the volatile memory, the system retrieves, by the volatile memory, the data from the volatile memory.

BRIEF DESCRIPTION OF THE FIGURES

In the figures, like reference numerals refer to the same figure elements.

DETAILED DESCRIPTION

Figure 1A:
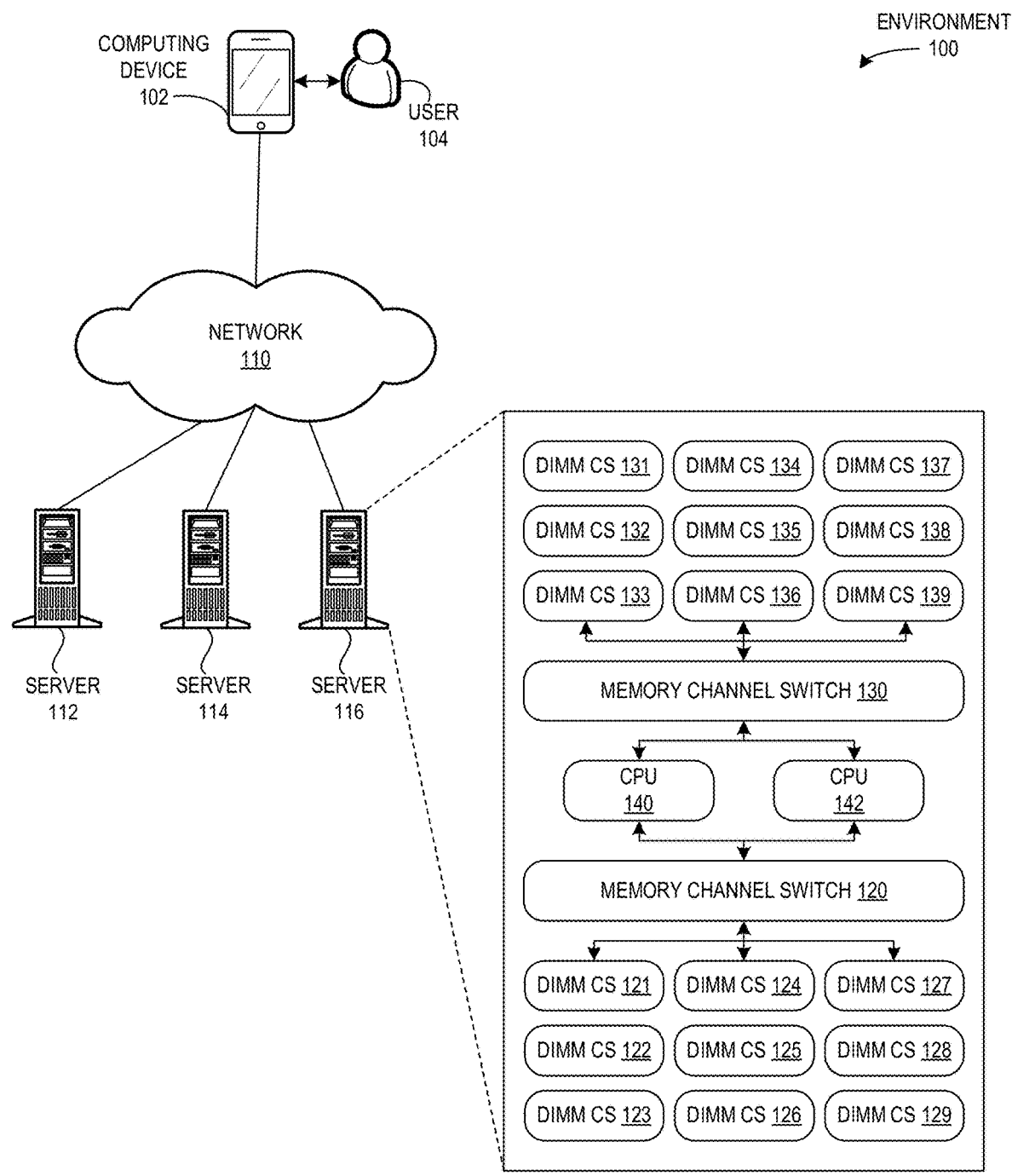
FIG. 1A illustrates an exemplary environment that facilitates a high-density converged storage system, in accordance with an embodiment of the present application.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of increasing the efficiency in a storage system by placing volatile memory and non-volatile memory on the same storage device, along with a simplified controller to manage the data path. In a standard storage system, a server is typically connected to volatile memory (such as DIMM DRAM) via a memory bus, and to non-volatile memory (such as an SSD or NAND) via a serial bus protocol. Processing an I/O request via a serial bus protocol may require approximately 4 to 25 µs (~4 µs for NVMe, ~5 µs for PCIe, and ~25 µs for SAS/SATA), while processing an I/O request via a memory bus may only require 1 µs. As a result, the latency involved in a storage system using a serial bus protocol to access non-volatile memory serves as an upper bound for optimization. However, as current applications pursue increasingly aggressive performance (e.g., TOPS, throughput, latency, etc.), the higher latency associated with the serial bus protocols may decrease the efficiency of the storage system.

The embodiments described herein address this inefficiency by co-locating the volatile memory and the non-volatile memory, along with a controller, on the same "converged storage" device. For example, a converged storage device can be a DIMM which includes DRAM modules as well as several NAND flash modules, along with a data path controller module which processes, temporarily stores (in a data buffer), and converts data between the DRAM format and the NAND format. This converged storage device can communicate with a processor of a server via a memory bus. The latency required for a processor to access, via a high-speed memory bus, data on the NAND flash modules residing on the converged storage device (via the DRAM modules and the controller) can be much lower than the latency required for a processor to access, via the traditional serial bus protocol, data on NAND flash modules residing on an SSD.

Furthermore, by including a memory channel switch between a processor and multiple converged storage devices, the embodiments described herein can provide an architecture which includes a high-density server chassis, as described below in relation to FIG. 1A. Such a server may also use the residual charge in its motherboard to write the contents of the controller's data buffer into the non-volatile memory (e.g., NAND flash).

Thus, the embodiments described herein provide a system which improves the efficiency of a storage system, where the improvements are fundamentally technological. The improved efficiency can include an improved performance in latency for completion of I/O tasks. The system provides a technological solution (i.e., a converged storage device which places the volatile memory and the non-volatile memory on the same storage device, and includes a simplified controller module to process the data between the volatile memory and the non-volatile memory) to the technological problem of reducing latency in I/O tasks and improving the overall efficiency of the system.

The term "storage server" refers to a server which can include multiple drives and multiple memory modules.

The term "converged storage device" or "CS" or "CS device" refers to a device, as described herein, which includes volatile memory, a controller module, and non-volatile memory on the same device.

The term "volatile memory" refers to computer storage which can lose data quickly upon removal of the power source, such as DRAM. Volatile memory is generally located physically proximal to a processor and accessed via a memory bus. In the embodiments described herein, volatile memory is located on a converged storage device.

The term "non-volatile memory" refers to long-term persistent computer storage, such as a NAND flash memory of an SSD. Non-volatile memory is generally located in an SSD or other peripheral component and accessed over a serial bus protocol. However, in the embodiments described herein, non-volatile memory is co-located on a converged storage device with volatile memory, and accessed over a memory bus via the volatile memory.

The terms "data path controller module," "controller module," and "controller" refer to a module located in a converged storage device, and may be used interchangeably. In the embodiments described herein, the controller is situated in the data path between the volatile memory and the non-volatile memory. The controller also includes a data buffer, into which data is written for temporary storage, and subsequently written or flushed into non-volatile memory. The controller's data buffer can also include data which is being processed by the controller, including encoded/decoded, compressed/decompressed, encrypted/decrypted, ECC-encoded/-decoded, and formatted/re-formatted data as described below in relation to FIG. 3.

The term "ECC-encoding" refers to encoding data based on an error correction code, while the term "ECC-decoding" refers to decoding data based on the error correction code. An "ECC-encoder/decoder" is a module which performs ECC-encoding/decoding.

A "CRC encoder/decoder" is a module which performs encoding/decoding based on a cyclic redundancy check.

A "data formatter" is a module which adjusts a format of data from a first format to a second format, e.g., from a DRAM format for volatile memory to a NAND format for non-volatile memory. A "data re-formatter" is a module which adjusts a format of data from a second format to a first format, e.g., from a NAND format to a DRAM format.

Exemplary System

FIG. 1A illustrates an exemplary environment 100 that facilitates a high-density converged storage system, in accordance with an embodiment of the present application. Environment 100 can include a computing device 102 which is associated with a user 104. Computing device 102 can include, for example, a tablet, a mobile phone, an electronic reader, a laptop computer, a desktop computer, or any other computing device. Computing device 102 can communicate via a network 110 with servers 112, 114, and 116, which can be part of a distributed storage system. Servers 112-116 can include a storage server, which can include multiple CPUs, memory channel switches, and converged storage (CS) devices. A CPU may be connected to multiple memory channel switches, and a memory channel switch allows the CPU to communicate with multiple sets of converged storage devices. The motherboard of a storage server may be customized with a number of DIMM slots, and the DIMM channel switches may be placed to select a specific DIMM channel.

For example, server 116 can include a CPU 140 and a CPU 142, each of which is connected to a memory channel switch 120 and a memory channel switch 130. Memory channel switch 120 can be connected to three groups of DIMM Converged Storage (CS) devices: 121, 122, and 123; 124, 125, and 126; and 127, 128, and 129. Similarly, memory channel switch 130 can be connected to three groups or channels of DIMM CS devices: 131, 132, and 133; 134, 135, and 136; and 137, 138, and 139. Server 116 depicts a high-capacity or high-density server chassis which uses the high-speed converged storage of the embodiments described herein. A general data flow is described below in relation to FIGS. 1C, 2A, and 2B. An exemplary data flow in a write operation is described below in relation to FIGS. 2A, 3, and 4A, and an exemplary data flow in a read operation is described below in relation to FIGS. 2A, 3, and 5A.

Exemplary Environment in the Prior Art Vs. Exemplary Embodiment

Figure 1C:
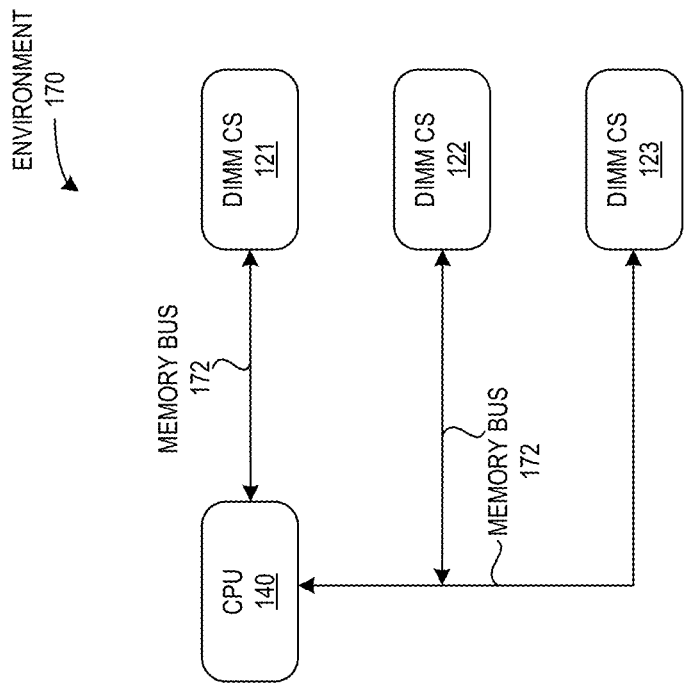
FIG. 1C illustrates an exemplary environment that facilitates a high-density converged storage system, in accordance with an embodiment of the present application.
Figure 1B:
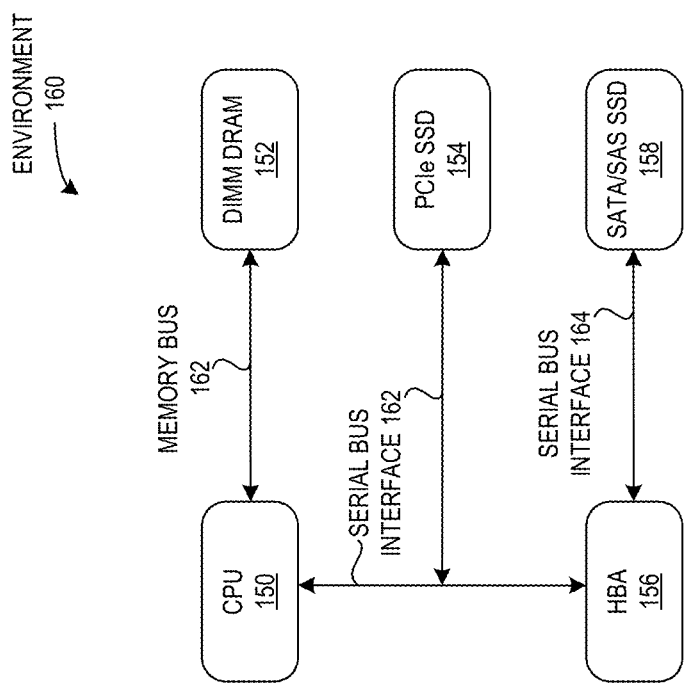
FIG. 1B illustrates an exemplary environment for storing data in the prior art.

FIG. 1B illustrates an exemplary environment 160 for storing data in the prior art. Environment 160 can include a CPU 150 which communicates with a DIMM DRAM 152 (volatile memory) via a memory bus 162. CPU 150 can also communicate via a serial bus interface 162 with a PCIe SSD 154 (non-volatile memory). Interface 162 can use a PCIe protocol. CPU 150 can also communicate via serial bus interface 162 with a host bus adaptor (HBA) 156, which communicates via a serial bus interface 164 with an SATA/SAS SSD 158 (non-volatile memory). Interface 164 can use an NVMe, SATA, or SAS protocol. As depicted in environment 160, in order for data to be stored on non-volatile memory such as PCIe SSD 154 or SATA/SAS SSD 158, the data must travel through serial bus interface 162 and/or 164. This may result in a high latency.

Furthermore, data is typically written first to volatile memory, and then moved to non-volatile memory. For example, data which is to be written to a NAND flash on SSD 158 must first travel from CPU 150 to DRAM 152 via memory bus 162, and subsequently travel from DRAM 152 back to CPU 150 via memory bus 162, and to SSD 154 via serial bus interface 162 or to SSD 158 via HBA 156 and serial bus interface 164. In addition, each intermediary device along the path (e.g., CPU 150 and HBA 156) must consume resources to properly process and transfer the data. Thus, a typical data path in the prior art may result in a high latency.

FIG. 1C illustrates an exemplary environment 170 that facilitates a high-density converged storage system, in accordance with an embodiment of the present application. In environment 170, a CPU 140 is connected via a memory bus 172 to converged storage devices, i.e., each of DIMM CS 121, 122, and 123, as depicted above in FIG. 1A. As described below in relation to FIGS. 2A, 4A, and 5A, embodiments of the converged storage device include both the volatile memory and the non-volatile memory in the same module (e.g., on the same DIMM card or chip). By co-locating the volatile memory and the non-volatile memory in the same storage device, and accessing the storage device via a memory bus, the converged storage device of environment 170 can provide an improved and lower latency over environment 160.

Thus, data which is to be written to a NAND flash on any of DIMM CS 121, 122, and 123, need only travel once via memory bus 172 (as opposed to the long route described above via CPU, DRAM, CPU, HBA, and SSD, in the example for environment 160). In the embodiments described herein, the data to be written further travels from the DRAM of the converged storage device to NAND flash of the same converged storage device via an internal controller module, as described below in relation to FIG. 2A. However, this internal travel within the converged storage device via the controller module creates only a very low latency as compared to the latency described above in environment 160.

Exemplary Converged Storage Device and Exemplary Server

Figure 2A:
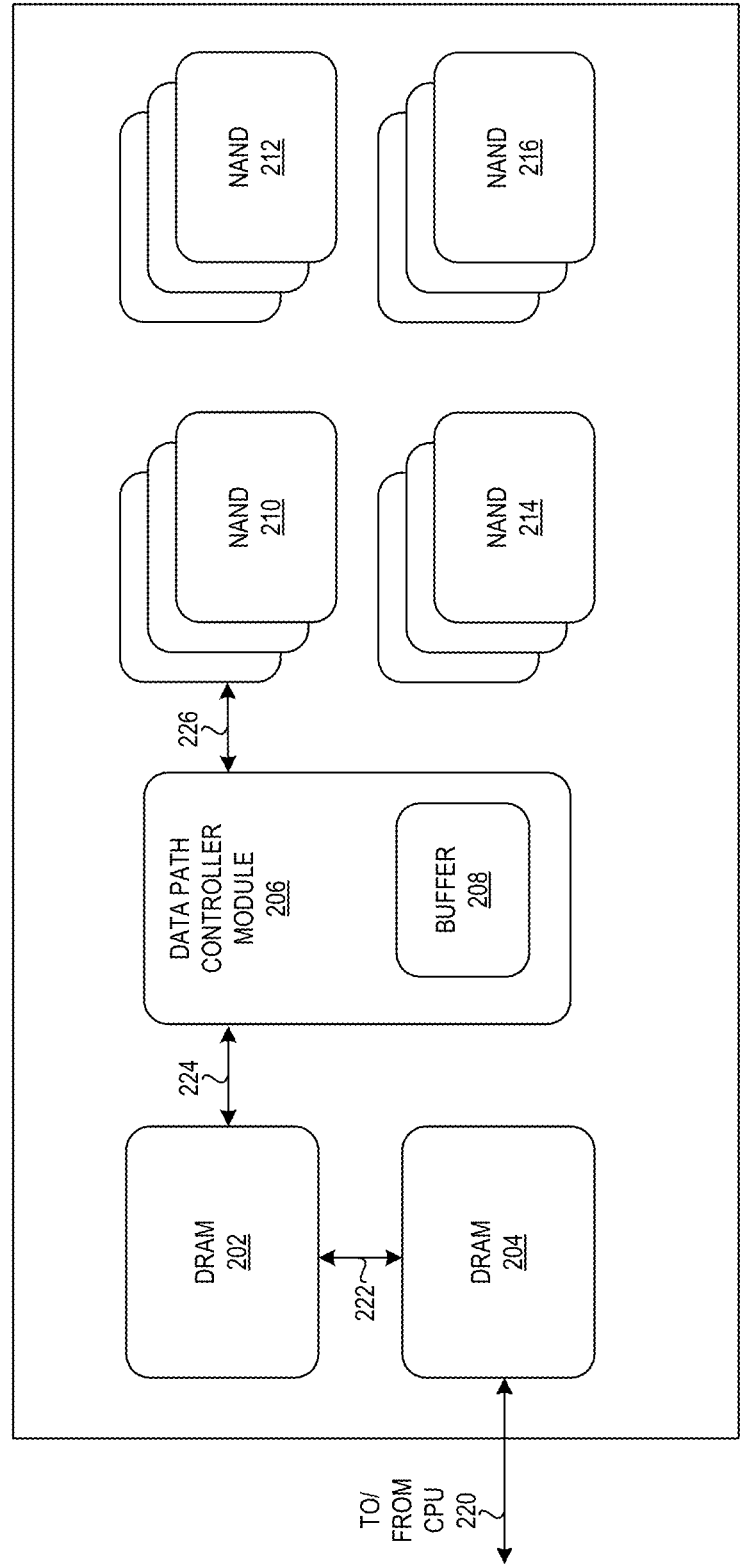
FIG. 2A illustrates an exemplary converged storage device, in accordance with an embodiment of the present application.

FIG. 2A illustrates an exemplary converged storage device 200, in accordance with an embodiment of the present application. Converged storage device 200 can be a DIMM module or component. For example, converged storage 200 can correspond to DIMM CS s 121-129 and 131-139 of FIG. 1A. Converged storage device 200 can include: a DRAM module 202; a DRAM module 204; a data path controller module 206 with a buffer 208; and NAND memory modules 210, 212, 214, and 216, each of which can include multiple NAND pages. Controller module 206 does not require firmware, nor does it require a flash translation layer (FTL). FTL operations can be performed by a module in the DRAM, as described below in relation to FIG. 2B.

Data can flow to/from a CPU via a communication 220, which can occur over a memory bus, and not over a serial protocol bus. For example, in a write operation, data flows from a CPU, e.g., to DRAM 204 via communication 220, to DRAM 202 via a communication 222, to data path controller module 206 via a communication 224, and to the appropriate NAND (e.g., NAND 210 via a communication 226). The communications involved in a write operation are described below in relation to FIGS. 4A and 4B.

In a read operation, the data flows in reverse. For example, data flows from a specific NAND, e.g., from NAND 210 to data path controller module 206 via communication 226, to DRAM 202 via communication 224, to DRAM 204 via communication 222, and to the CPU via communication 220 (i.e., the memory bus). The communications involved in a read operation are described below in relation to FIGS. 5A and 5B. Note that data may arrive at controller module 206 at varying latencies. That is, some data may require more or less time to be received and processed by controller module 206. Controller module 206 can store received data in buffer 208 to handle the differences in throughput.

Converged storage 200 can use its volatile memory (i.e., DRAMs 202 and 204) in the same manner as conventional volatile memory by following, e.g., the DRAM protocol to match the memory controller within the CPU. Converged storage 200 essentially exposes a memory device with the capacity of DRAM, and a block device proportional to the NAND flash on the same DIMM printed circuit board (PCB).

Figure 2B:
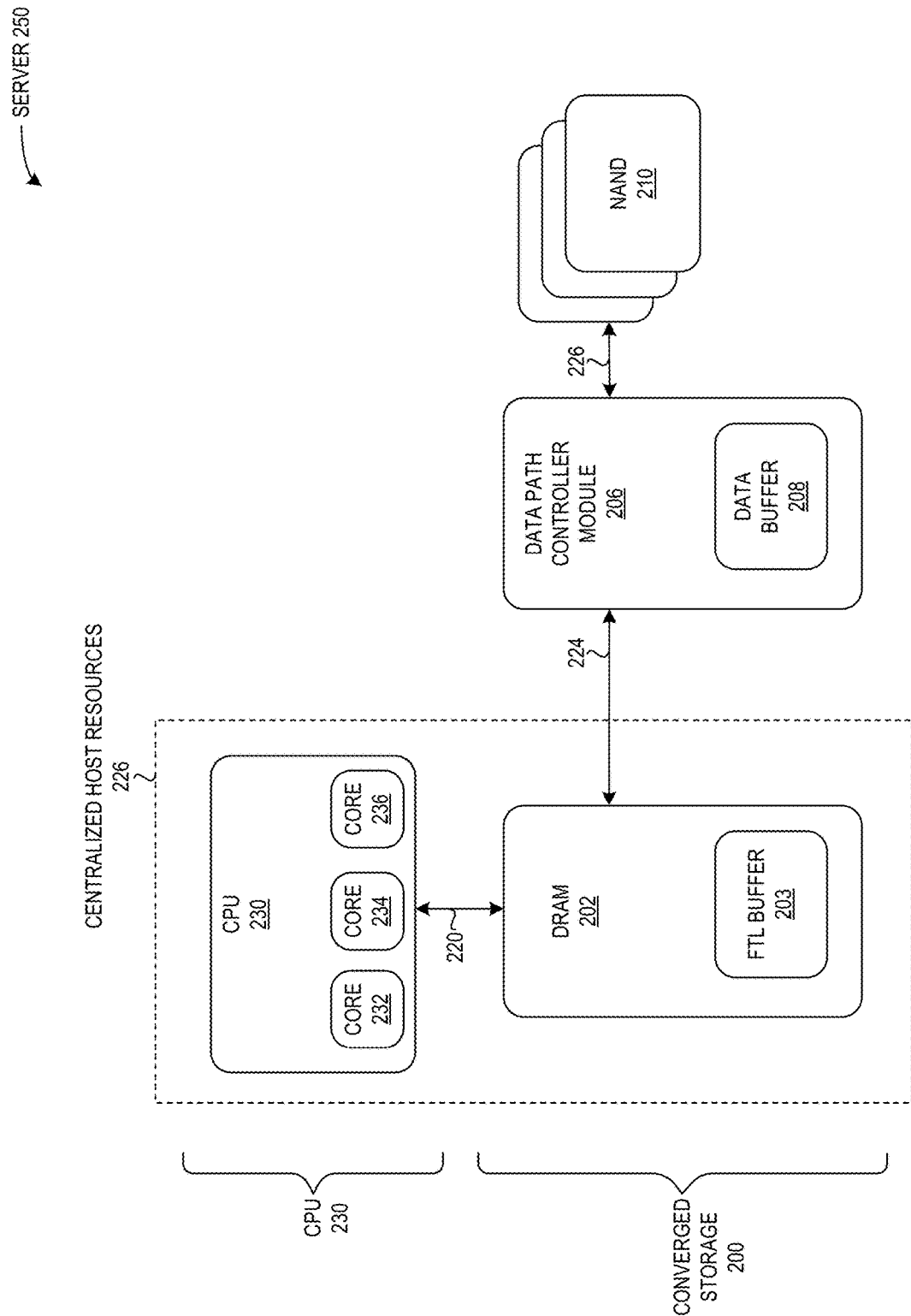
FIG. 2B illustrates an exemplary server with centralized host resources, in accordance with an embodiment of the present application.

FIG. 2B illustrates an exemplary server 250 with centralized host resources, in accordance with an embodiment of the present application. Server 250 can correspond to servers 112, 114, and 116 of FIG. 1A. Server 250 can include a CPU 230 and a converged storage 200. CPU 230 can include cores 232, 234, and 236. Converged storage 200 can include a DRAM module 202 with an FTL buffer 203; a data path controller module 206 with a data buffer 208; and a set of NAND memory pages 210.

Server 250 depicts centralized host resources 226, which includes CPU 230 and DRAM 202. CPU 230 and DRAM 202 are connected via a memory bus 220 (i.e., communication 220). Data path controller module 206 may consist only of logic circuits. NAND flash memory 210 is managed by the host CPU (CPU 230) and the DRAM exposed to the host (DRAM 202). Server 250 uses its own CPU 230 to handle the NAND flash storage interrupt functions and other processing operations, instead of using an embedded processor. Furthermore, the host DRAM (DRAM 202) allocates the space for accommodating FTL content. Data path controller module 206 performs the data processing (as described below in relation to FIG. 3) and further acts as the media interface to bridge NAND flash 210 to DRAM 202.

Thus, by placing the non-volatile memory on the same storage device as the volatile memory, and including a controller module, the embodiments of the converged storage device described herein provide a system in which I/O requests result in a reduced latency because they need travel only once via a high-speed memory bus, as opposed to the higher latency involved in a traditional storage device architecture.

Exemplary Data Path Controller Module

Figure 3:
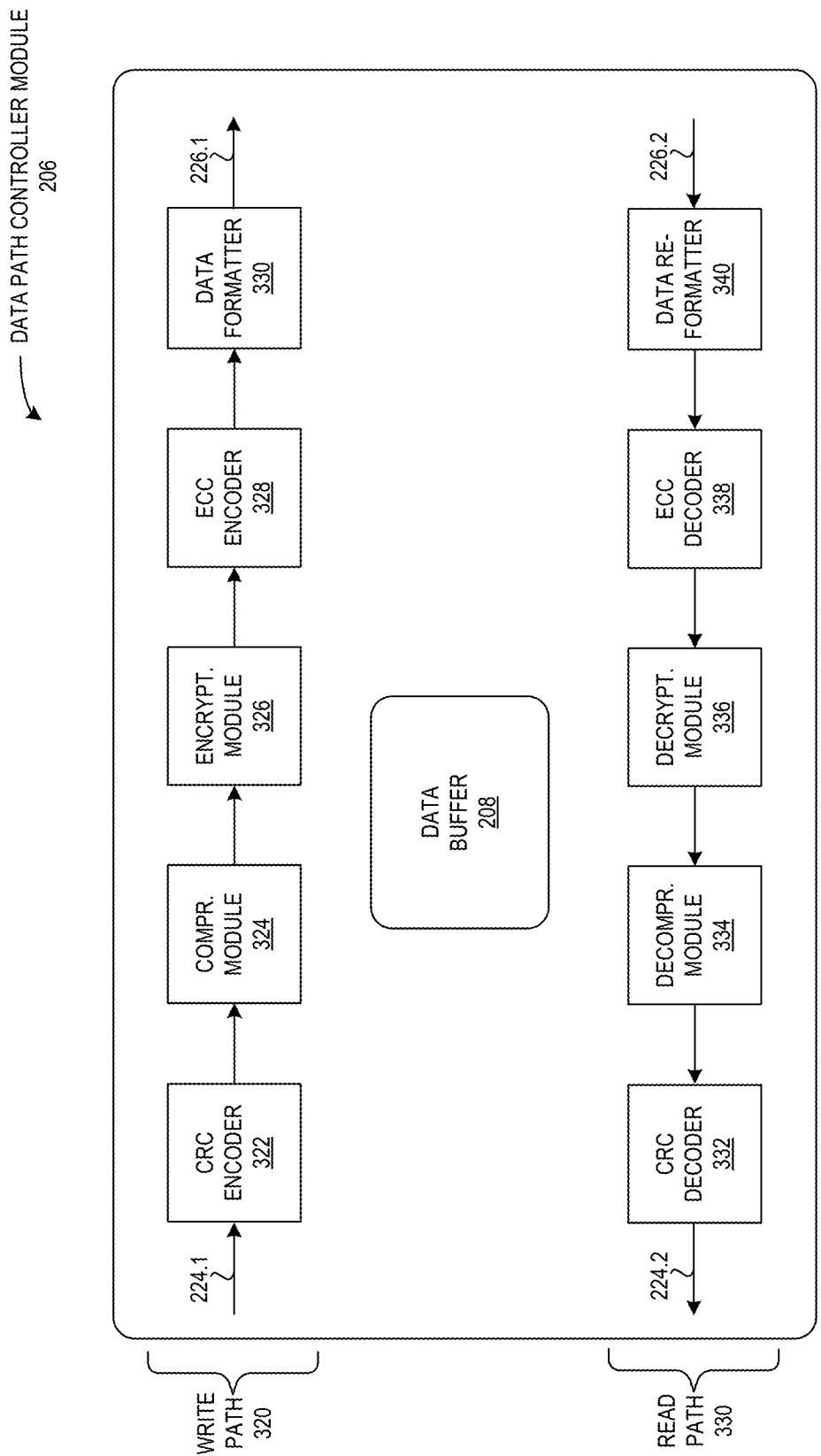
FIG. 3 presents an exemplary data path controller module, in accordance with an embodiment of the present application.

FIG. 3 presents exemplary data path controller module 206, in accordance with an embodiment of the present application and as described above in relation to FIGS. 2A and 2B. Controller module 206 includes a write path 320 and a read path 330. In write path 320, controller module 206 can receive, via a communication 224.1 (e.g., from DRAM 202), data to be processed. CRC encoder 322 can encode the data based on a cyclic redundancy check. Compression module 324 can compress the encoded data. Encryption module 326 can encrypt the compressed data. ECC encoder 328 can encode the encrypted data based on an error correction code (ECC). Data formatter 330 can adjust a format of the ECC-encoded data, i.e., convert the format of the data from a format for the volatile memory to a format for the non-volatile memory. Data path controller module 206 can write the formatted data to non-volatile memory in a communication 226.1 (e.g., to NAND 210).

In read path 330, controller module 206 can receive, via a communication 226.2 (e.g., from NAND 210), data to be processed and returned as part of a read request. Data re-formatter 340 can adjust a format of the retrieved data from the non-volatile memory, i.e., re-format or convert the format of the data from a format for the non-volatile memory to a format for the volatile memory. ECC decoder 338 can decode the adjusted data based on an error correction code (ECC). Decryption module 336 can decrypt the ECC-decoded data. Decompression module 334 can decompress the decrypted data. CRC decoder 332 can decode the decompressed data based on a cyclic redundancy check. Controller module 206 can return the retrieved data in a communication 224.2 via the volatile memory (e.g., to CPU 230 via DRAM 202).

Note that in FIG. 3, data buffer 208 is depicted without communications to any specific module, indicating that any component of controller module 206 may, at any time, store data in data buffer 208. For example, any of the modules in controller module 206 may store data in data buffer 208 both prior to and subsequent to manipulating (e.g., encoding/decoding, encrypting/decrypting, compressing/decompressing, formatting/re-formatting, etc.) the data. Furthermore, controller module 206 may store data in data buffer 208 upon receiving data from or transmitting data to volatile or non-volatile memory, e.g., prior to communication 226.1 and subsequent to communication 226.2, and subsequent to communication 224.1 and prior to communication 224.2.

Exemplary Communication During a Write Operation

Figure 4A:
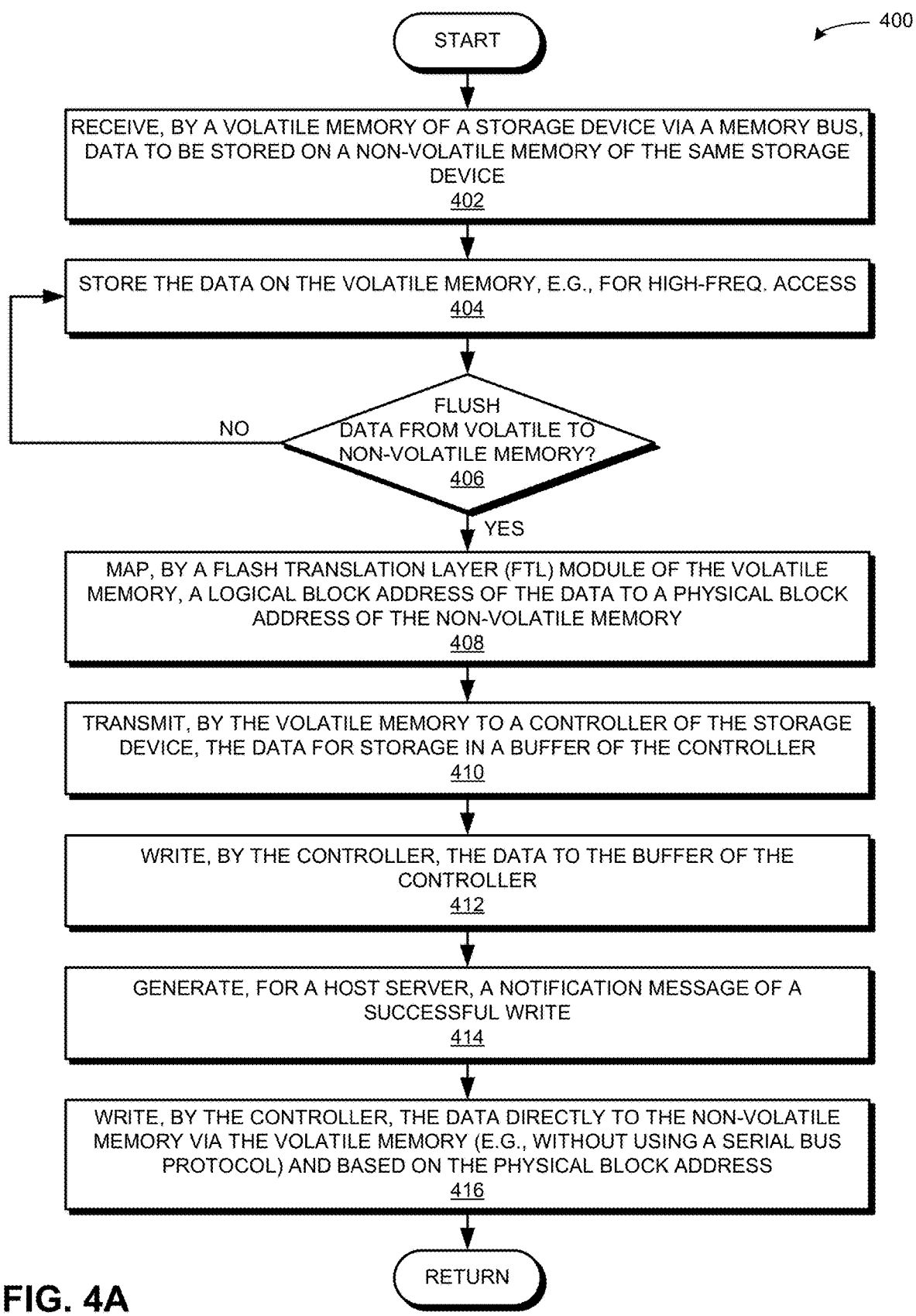
FIG. 4A presents a flowchart illustrating a method for writing data in a converged storage system, in accordance with an embodiment of the present application.

FIG. 4A presents a flowchart 400 illustrating a method for writing data in a converged storage system, in accordance with an embodiment of the present application. During operation, the system receives, by a volatile memory of a storage device via a memory bus, data to be stored on a non-volatile memory of the same storage device (operation 402). The system stores the data on the volatile memory, e.g., for high-frequency access (operation 404). If the system does not determine a condition to flush the data from volatile to non-volatile memory (decision 406), the system continues to store the data on the volatile memory (operation 404). If the system does determine a condition to flush the data from volatile to non-volatile memory (decision 406), the system maps, by a flash translation layer (FTL) module of the volatile memory, a logical block address of the data to a physical block address of the non-volatile memory (operation 408). The system transmits, by the volatile memory to a controller of the storage device, the data for storage in a buffer of the controller (operation 410). The system writes, by the controller, the data to the buffer of the controller (operation 412). The system generates, for a host server, a notification message of a successful write operation (operation 414). The system writes, by the controller, the data directly to the non-volatile memory via the volatile memory (e.g., without using a serial bus protocol) and based on the physical block address (operation 416).

Figure 4B:
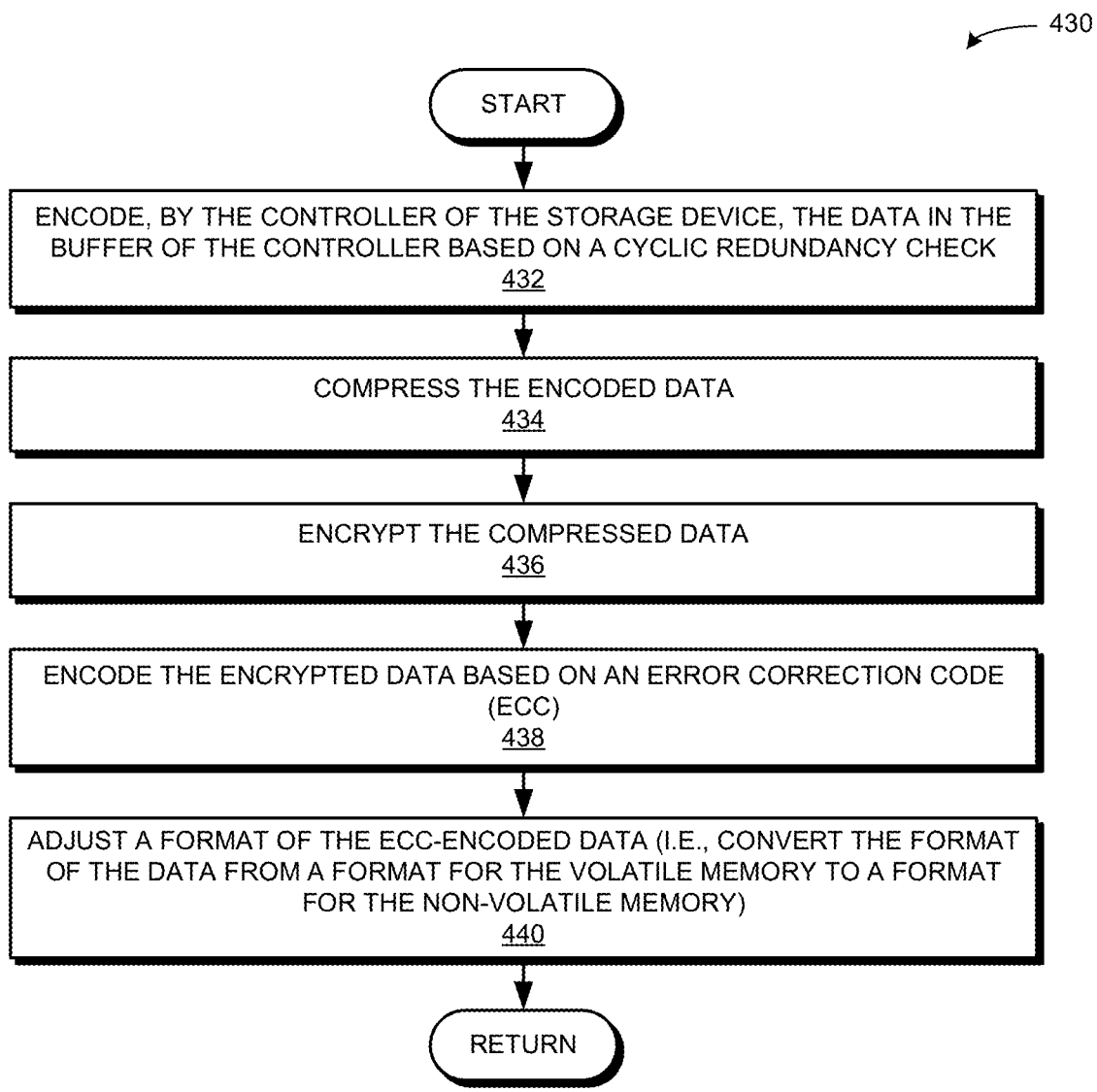
FIG. 4B presents a flowchart illustrating a method for writing and processing data in a converged storage system, in accordance with an embodiment of the present application.

FIG. 4B presents a flowchart 430 illustrating a method for writing and processing data in a converged storage system, in accordance with an embodiment of the present application. Flowchart 430 corresponds to operation 416 of FIG. 4A. During operation, the system encodes, by the controller of the storage device, the data in the buffer of the controller based on a cyclic redundancy check (operation 432). The system compresses the encoded data (operation 434) and encrypts the compressed data (operation 436). The system encodes the encrypted data based on an error correction code (ECC) (operation 438). The system adjusts a format of the ECC-encoded data (i.e., converts the format of the data from a format for the volatile memory to a format for the non-volatile memory) (operation 440).

Exemplary Communication During a Read Operation

Figure 5A:
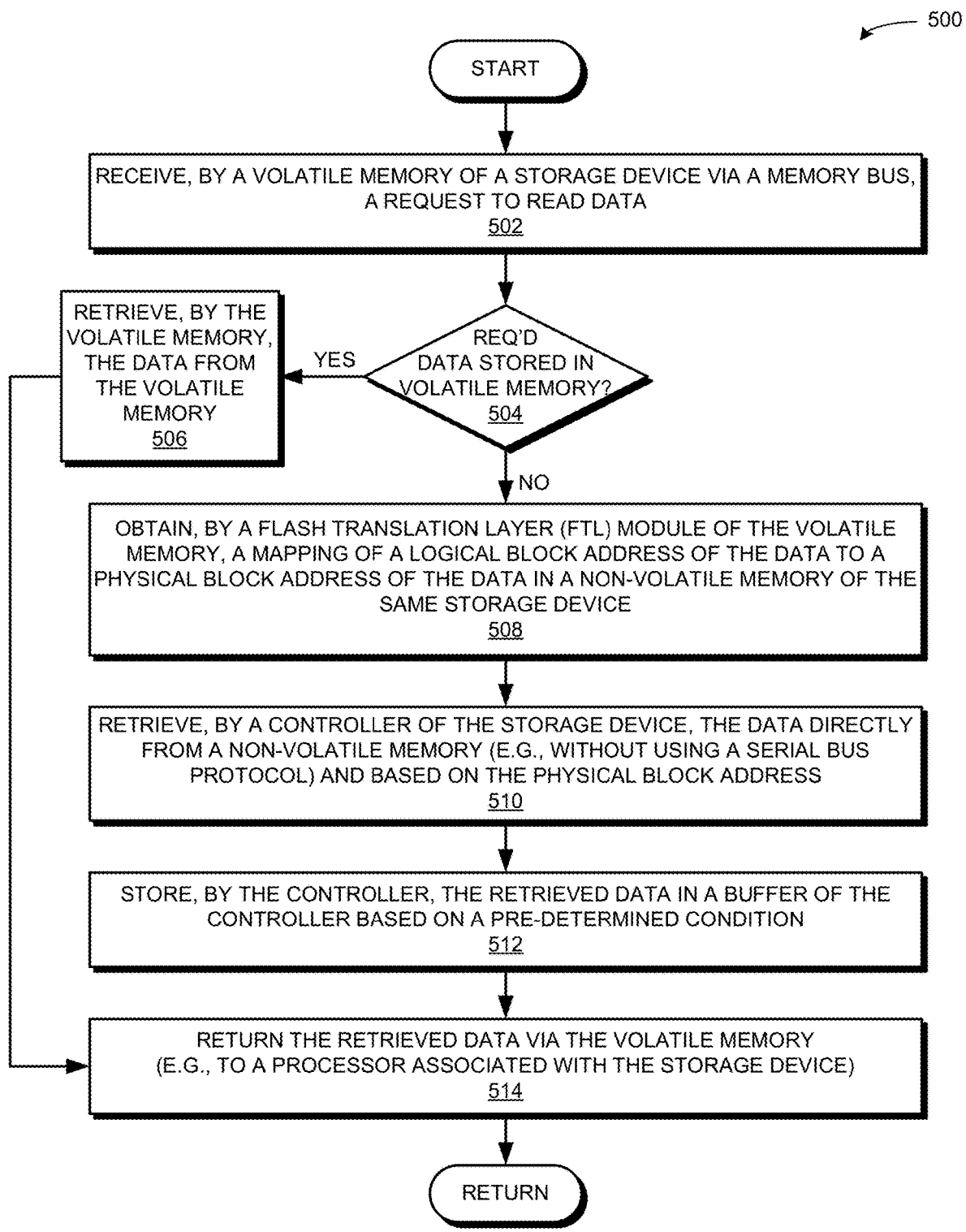
FIG. 5A presents a flowchart illustrating a method for reading data in a converged storage system, in accordance with an embodiment of the present application.

FIG. 5A presents a flowchart 500 illustrating a method for reading data in a converged storage system, in accordance with an embodiment of the present application. During operation, the system receives, by a volatile memory of a storage device via a memory bus, a request to read data (operation 502). If the system determines that the requested data is stored in the volatile memory (decision 504), the system retrieves, by the volatile memory, the data from the volatile memory (operation 506). The system returns the retrieved data via the volatile memory (e.g., to a processor associated with the storage device) (operation 514).

If the system determines that the requested data is not stored in the volatile memory (decision 504), the system obtains, by a flash translation layer (FTL) module of the volatile memory, a mapping of a logical block address of the data to a physical block address of the data in a non-volatile memory of the same storage device (operation 508). The system retrieves, by a controller of the storage device, the data directly from the non-volatile memory (e.g., without using a serial bus protocol) and based on the physical block address (operation 510). The system stores, by the controller, the retrieved data in a buffer of the controller based on a pre-determined condition (operation 512). For example, the pre-determined condition may include a rule to store the retrieved data upon first receiving the data from the non-volatile storage, upon translating a format of the data from the non-volatile storage, upon detecting a loss in power, or upon transmitting the data to the volatile memory. The system returns the retrieved data via the volatile memory (e.g., to a processor associated with the storage device) (operation 514).

Figure 5B:
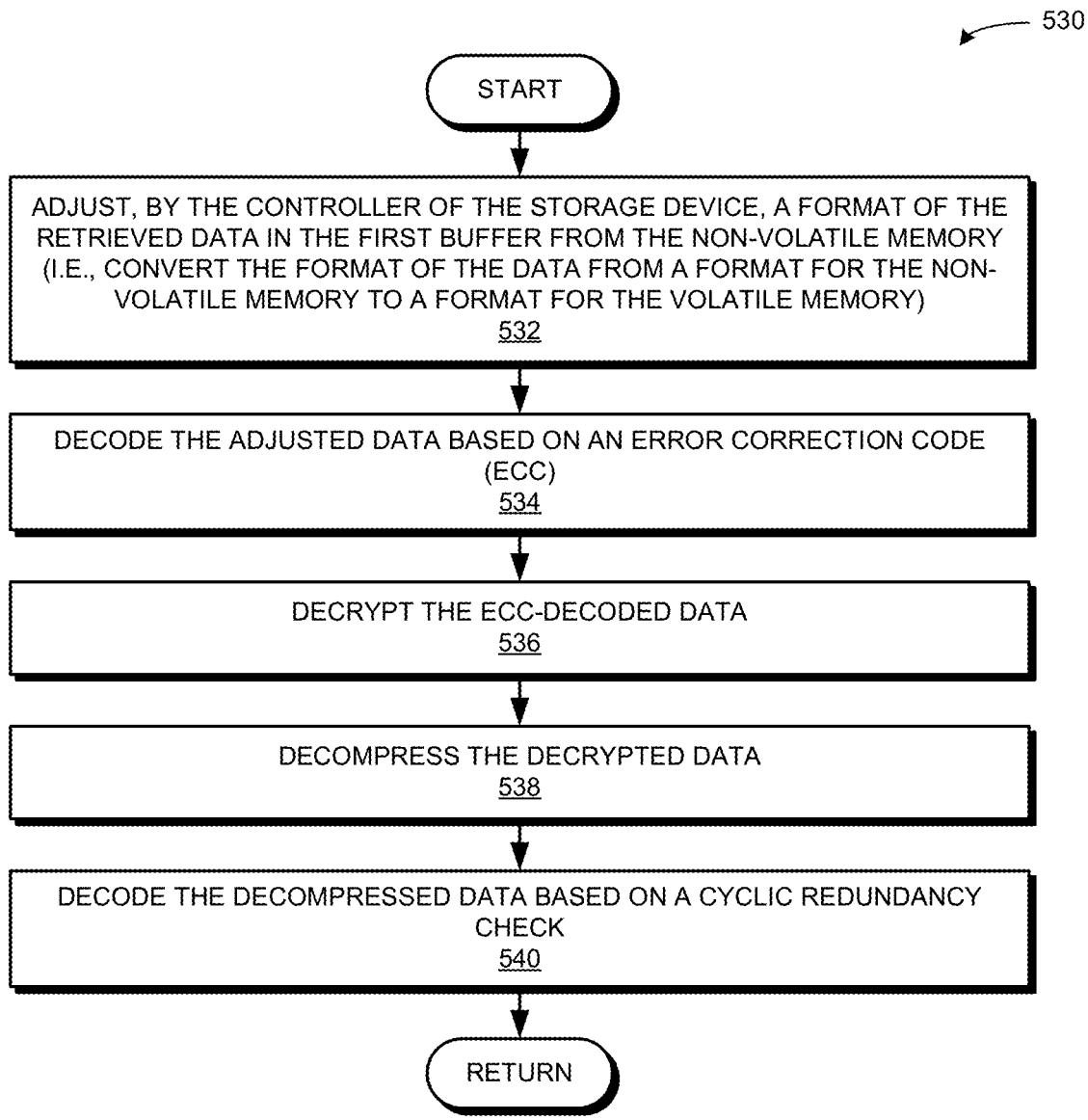
FIG. 5B presents a flowchart illustrating a method for reading and processing data in a converged storage system, in accordance with an embodiment of the present application.

FIG. 5B presents a flowchart 530 illustrating a method for reading and processing data in a converged storage system, in accordance with an embodiment of the present application. Flowchart 530 corresponds to operation 510 of FIG. 5A. During operation, the system adjusts, by the controller of the storage device, a format of the retrieved data in the first buffer from the non-volatile memory (i.e., converts the format of the data from a format for the non-volatile memory to a format for the volatile memory) (operation 532). The system decodes the adjusted data based on an error correction code (ECC) (operation 534). The system decrypts the ECC-decoded data (operation 536), and decompresses the decrypted data (operation 538). The system decodes the decompressed data based on a cyclic redundancy check (operation 540).

Using the Residual Charge of the Motherboard to Write Data to Non-Volatile Memory The embodiments described herein can use the residual charge in the server's motherboard to write the content of the controller's data buffer into non-volatile memory (e.g., NAND flash). Typically, a motherboard includes many capacitors for decoupling and filtering functions. Circuits which route long distances can also form equivalent capacitance. When the server is functioning normally, these capacitors are fully charged. In the event of a power failure, the equivalent capacitors must discharge their residual charge. By controlling the size of the controller's data buffer, the system can use the residual charge to provide sufficient energy to flush or write the data in the controller's data buffer into non-volatile memory (e.g., NAND flash). A dedicated capacitor and related circuit is not necessary in the converged storage device of the embodiments described herein. Instead, a power-detecting circuit of the converged storage device can determine a loss in power below a pre-determined threshold, which can trigger the controller to flush the data in the data buffer into the NAND flash.

Figure 6:
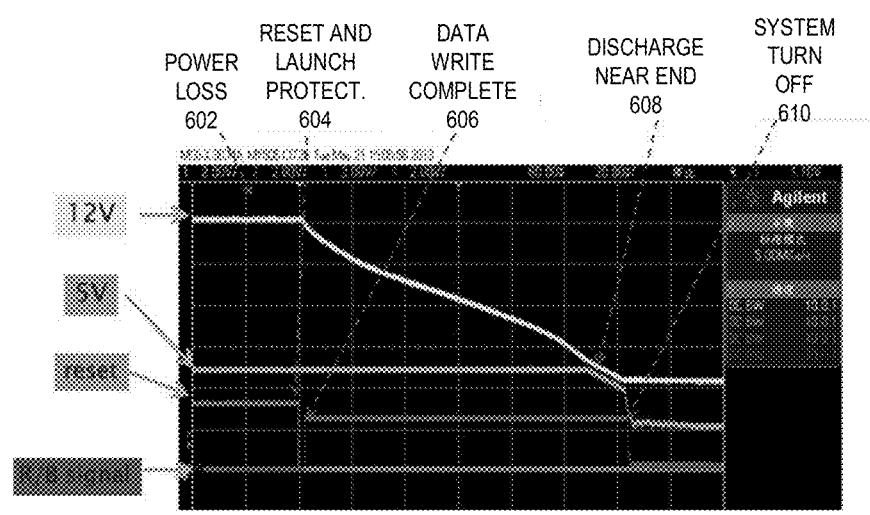
FIG. 6 illustrates exemplary test results of using the residual charge of a motherboard to write data into non-volatile memory, in accordance with an embodiment of the present application.

FIG. 6 illustrates exemplary test results 600 of using the residual charge of a motherboard to write data into non-volatile memory, in accordance with an embodiment of the present application. Test results 600 may be achieved by performing repeated experiments on varying sizes of the data buffer in the controller module (e.g., data buffer 208 in data path controller module 206 of FIG. 3). After a power loss 602 of the motherboard, the system performs a reset and launch protection 604. The system subsequently writes the data from the controller's data buffer into non-volatile memory (e.g., flushes the data into NAND memory), which is accomplished within 5 ms, as shown by a data write complete 606. The 5 ms of time between the reset and launch protection 604 and the data write complete 606 is only a small portion of the motherboard's discharge. The "almost" end of the mother's board discharge is shown by a discharge near end 608, while the shut off of the system itself is shown by a system turn off 610.

Exemplary Computer System and Apparatus

Figure 7:
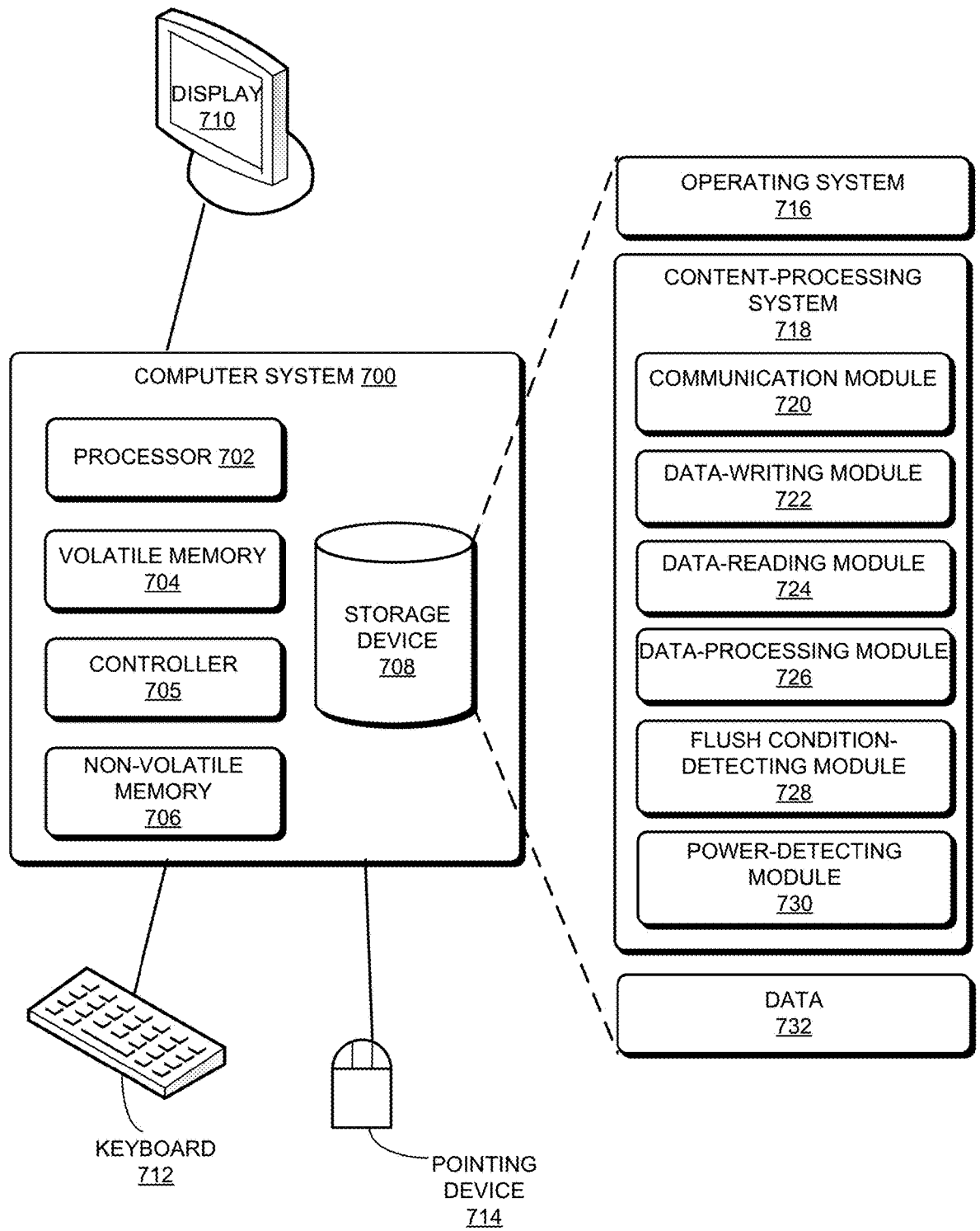
FIG. 7 illustrates an exemplary computer system that facilitates a high-density converged storage system, in accordance with an embodiment of the present application.

FIG. 7 illustrates an exemplary computer system 700 that facilitates a high-density converged storage system, in accordance with an embodiment of the present application. Computer system 700 includes a processor 702, a volatile memory 704, a controller 705, a non-volatile memory 706, and a storage device 708. Computer system 700 may be a client-serving machine. Volatile memory 704 can include, e.g., RAM, that serves as a managed memory, and can be used to store one or more memory pools. Non-volatile memory 706 can include persistent storage that is accessed via controller 705. Furthermore, computer system 700 can be coupled to a display device 710, a keyboard 712, and a pointing device 714. Storage device 708 can store an operating system 716, a content-processing system 718, and data 732.

Content-processing system 718 can include instructions, which when executed by computer system 700, can cause computer system 700 to perform methods and/or processes described in this disclosure. Specifically, content-processing system 718 can include instructions for receiving and transmitting data packets, including a request to write or read data, and data to be processed (e.g., encoded, encrypted, compressed, adjusted) and stored. Content-processing system 718 can further include instructions for receiving, by a volatile memory of a storage device via a memory bus, data to be stored on a non-volatile memory of the same storage device (communication module 720). Content-processing system 718 can include instructions for writing, by a controller of the storage device, the data directly to the non-volatile memory via the volatile memory (data-writing module 722).

Content-processing system 718 can also include instructions for receiving, by a volatile memory of a storage device via a memory bus, a request to read data (communication module 720). Content-processing system 718 can include instructions for retrieving, by a controller of the storage device, the data directly from a non-volatile memory of the same storage device (data-reading module 724). Content-processing system 718 can include instructions for returning the retrieved data via the volatile memory (communication module 720).

Content-processing system 718 can additionally include instructions for processing the data (data-processing module 726). Content-processing system 718 can include instructions for determining that the data in the volatile memory is to be flushed from the volatile memory and written to the non-volatile memory (flush condition-detecting module 728). Content-processing system 718 can additionally include instructions for determining a loss in power below a predetermined threshold (power-detecting module 730).

Data 732 can include any data that is required as input or that is generated as output by the methods and/or processes described in this disclosure. Specifically, data 732 can store at least: data to be written, read, stored, or accessed; processed or stored data; encoded or decoded data; encrypted or compressed data; decrypted or decompressed data; an error correction code (ECC) encoding or decoding; an indicator of whether data is stored in volatile memory or non-volatile memory; a logical block address; a physical block address; a first buffer for data in a controller module; a second buffer for data in volatile memory; a condition to flush data from volatile to non-volatile memory; a format for data in volatile memory; a format for data in non-volatile memory; a pre-determined condition for storing data; a level of power; a loss in power level; and a predetermined threshold.

Figure 8:
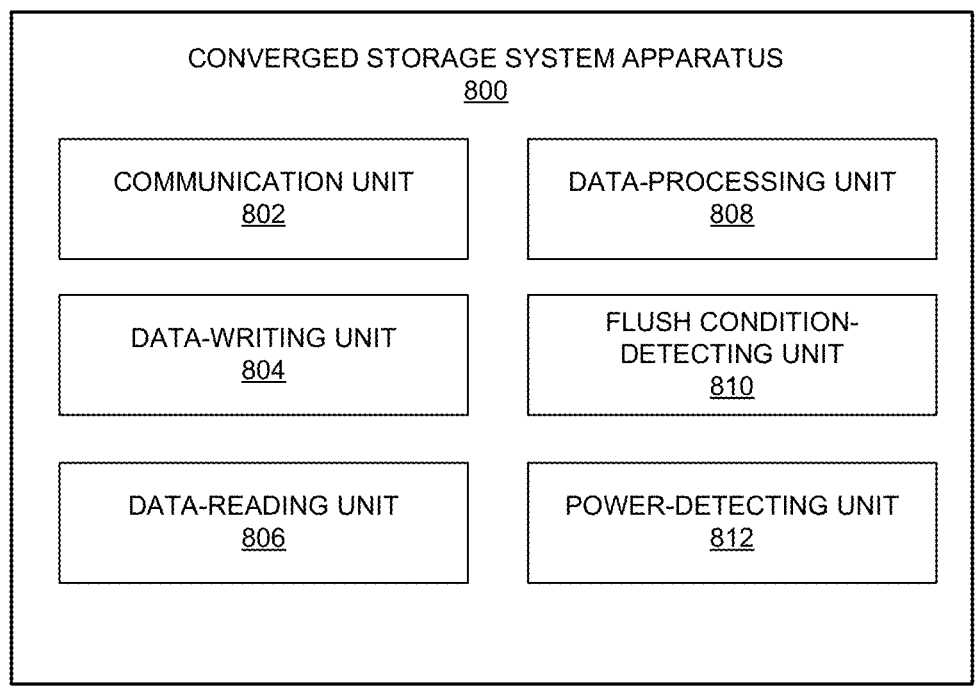
FIG. 8 illustrates an exemplary apparatus that facilitates a high-density converged storage system, in accordance with an embodiment of the present application.

FIG. 8 illustrates an exemplary apparatus 800 that facilitates a high-density converged storage system, in accordance with an embodiment of the present application. Apparatus 800 can comprise a plurality of units or apparatuses which may communicate with one another via a wired, wireless, quantum light, or electrical communication channel. Apparatus 800 may be realized using one or more integrated circuits, and may include fewer or more units or apparatuses than those shown in FIG. 8. Further, apparatus 800 may be integrated in a computer system, or realized as a separate device which is capable of communicating with other computer systems and/or devices. Specifically, apparatus 800 can comprise units 802-812 which perform functions or operations similar to modules 720-730 of computer system 700 of FIG. 7, including: a communication unit 802; a data-writing unit 804; a data-reading unit 806; a data-processing unit 808; a flush condition-detecting unit 810; and a power-detecting unit 812.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method for facilitating a high-density converged storage system, the method comprising:
    receiving, by a volatile memory of a storage device via a memory bus directly from a central processing unit of a host, data to be stored in a non-volatile memory of the same storage device,
    wherein a controller of the storage device is situated in a data path for the data between the volatile memory and the non-volatile memory, and
    wherein the data path for the data to be stored comprises the memory bus;
    transmitting, by the volatile memory to the controller of the storage device, the data for storage in a buffer of the controller; and
    writing, by the controller of the storage device via the data path, the data to the non-volatile memory based on the data as received by the volatile memory via the memory bus,
    wherein the volatile memory, the controller, and the non-volatile memory are co-located on the same storage device.

2. The method of claim 1, further comprising:
    mapping, by the volatile memory, a logical block address of the data to a physical block address of the non-volatile memory,
    wherein writing the data to the non-volatile memory is based on the physical block address.

3. The method of claim 1, further comprising:
    storing the data in a buffer of the volatile memory,
    wherein transmitting the data for storage in the buffer of the controller and writing the data to the non-volatile memory are in response to determining that the data in the buffer of the volatile memory is to be flushed from the volatile memory and written to the non-volatile memory.

4. The method of claim 1, further comprising:
    processing, by the controller, the data, which comprises:
        encoding the data based on a cyclic redundancy check;
        compressing the encoded data;
        encrypting the compressed data
        encoding the encrypted data based on an error correction code (ECC); and
        adjusting a format of the ECC-encoded data.

5. The method of claim 4, wherein while processing the data, the method further comprises:
    storing the data in a buffer of the controller based on a predetermined condition.

6. The method of claim 1, wherein the data is received by the volatile memory via one or more of:
a memory channel switch;
a switch; and
a multiplexing device.

7. The method of claim 1, wherein the high-density converged storage system includes the storage device and one or more other storage devices, and
wherein a respective storage device includes a volatile memory, a controller, and a non-volatile memory.

8. The method of claim 1, wherein writing the data to the non-volatile memory is in response to determining, by a power-detecting circuit of the storage device, a loss in power.

9. The method of claim 1, further comprising:
receiving, by the volatile memory of the storage device via the memory bus directly from the central processing unit of the host, a request to read the data previously written directly to the non-volatile memory via the volatile memory;
retrieving, by the controller of the storage device, the data from the non-volatile memory of the same storage device; and
returning the retrieved data via the volatile memory.

10. The method of claim 9, further comprising:
obtaining, by a flash translation layer module of the volatile memory, a mapping of a logical block address of the data to a physical block address of the data in the non-volatile memory,
wherein retrieving the data from the non-volatile memory is based on the physical block address, and
wherein the retrieved data is returned to a processor associated with the storage device.

11. The method of claim 9, further comprising:
processing, by the controller, the retrieved data, which comprises:
adjusting a format of the retrieved data;
decoding the adjusted data based on an error correction code (ECC);
decrypting the ECC-decoded data;
decompressing the decrypted data; and
decoding the decompressed data based on a cyclic redundancy check.

12. The method of claim 11, wherein while processing the retrieved data, the method further comprises:
storing the retrieved data in a first buffer of the controller based on a predetermined condition.

13. The method of claim 9, wherein retrieving the data from the non-volatile memory is in response to determining, by the volatile memory, that the data is not stored in the volatile memory, and wherein the method further comprises:
in response to determining that the data is stored in the volatile memory, retrieving, by the volatile memory, the data from the volatile memory.

14. A computer system for facilitating a high-density converged storage system, the system comprising:
a processor; and
a memory coupled to the processor and storing instructions, which when executed by the processor cause the processor to perform a method, the method comprising:
receiving, by a volatile memory of a storage device via a memory bus directly from a central processing unit of a host, data to be stored in a non-volatile memory of the same storage device,
wherein a controller of the storage device is situated in a data path for the data between the volatile memory and the non-volatile memory, and
wherein the data path for the data to be stored comprises the memory bus;
transmitting, by the volatile memory to the controller of the storage device, the data for storage in a buffer of the controller; and
writing, by the controller of the storage device via the data path, the data to the non-volatile memory based on the data as received by the volatile memory via the memory bus,
wherein the volatile memory, the controller, and the non-volatile memory are co-located on the same storage device.

15. The computer system of claim 14, wherein the method further comprises:
mapping, by the volatile memory, a logical block address of the data to a physical block address of the non-volatile memory,
wherein writing the data to the non-volatile memory is based on the physical block address.

16. The computer system of claim 14, wherein the method further comprises:
storing the data in a buffer of the volatile memory,
wherein transmitting the data for storage in the buffer of the controller and writing the data to the non-volatile memory are in response to determining that the data in the buffer of the volatile memory is to be flushed from the volatile memory and written to the non-volatile memory.

17. The computer system of claim 14, wherein the method further comprises:
processing, by the controller, the data, which comprises:
encoding the data based on a cyclic redundancy check;
compressing the encoded data;
encrypting the compressed data
encoding the encrypted data based on an error correction code (ECC); and
adjusting a format of the ECC-encoded data; and
wherein while processing the data, the method further comprises:
storing the data in a buffer of the controller based on a predetermined condition.

18. The computer system of claim 14, wherein the data is received by the volatile memory via one or more of:
a memory channel switch;
a switch; and
a multiplexing device.

19. The computer system of claim 14, wherein the high-density converged storage system includes the storage device and one or more other storage devices, and
wherein a respective storage device includes a volatile memory, a controller, and a non-volatile memory.

20. The computer system of claim 14, wherein writing the data to the non-volatile memory is in response to determining, by a power-detecting circuit of the storage device, a loss in power.

* * * * *